United States Patent [19]
Saeki

[11] Patent Number: 5,438,010
[45] Date of Patent: Aug. 1, 1995

[54] METHOD OF RELIABLY AND READILY MANUFACTURING A SEMICONDUCTOR DEVICE HAVING A CYLINDRICAL ELECTRODE

[75] Inventor: Takanori Saeki, Tokyo, Japan
[73] Assignee: NEC Corporation, Tokyo, Japan
[21] Appl. No.: 143,719
[22] Filed: Nov. 1, 1993
[30] Foreign Application Priority Data
  Oct. 30, 1992 [JP] Japan .................. 4-292831
[51] Int. Cl.[6] .............. H01L 27/00; H01L 21/70
[52] U.S. Cl. ........................ 437/52; 437/60; 437/919
[58] Field of Search ............ 437/52, 919, 52, 60

[56] References Cited

U.S. PATENT DOCUMENTS

| | | | |
|---|---|---|---|
| 5,140,389 | 8/1992 | Kimura et al. | 357/23.6 |
| 5,150,276 | 9/1992 | Gonzalez et al. | 361/313 |
| 5,266,512 | 11/1993 | Kirsch | 437/52 |

OTHER PUBLICATIONS

Patent Abstracts of Japan, JP 3057262, May 28, 1991.
Patent Abstracts of Japan, JP 3079072, Jun. 26, 1991.
Patent Abstracts of Japan, JP 3091957, Jul. 11 1991.
Patent Abstracts of Japan, JP 4264767, Jan. 29, 1993.
Patent Abstracts of Japan, JP 4212449, Nov. 27, 1992.

Primary Examiner—Olik Chaudhuri
Assistant Examiner—H. Jey Tsai
Attorney, Agent, or Firm—Sughrue, Mion, Zinn, Macpeak & Seas

[57] ABSTRACT

In a method of manufacturing a semiconductor device with a cylindrical electrode (64) by partially deleting an electrode-forming film (61) which is formed to cover a block (58a) and has a specific film portion, a covering film (62) is formed at first to cover the electrode-forming film. The electrode-forming film is made of one of a conductive material and a semiconductive material. Next, the covering film is etched so that the covering film has a particular film portion which is unetched to form a protective wall (63) covering the specific film portion. Subsequently, the electro-deforming film is etched with the block and the particular film portion preventing the specific film portion from being etched. As a result, the cylindrical electrode is formed by the specific film portion that is unetched. Thereafter, the block and the particular film portion are removed.

4 Claims, 10 Drawing Sheets

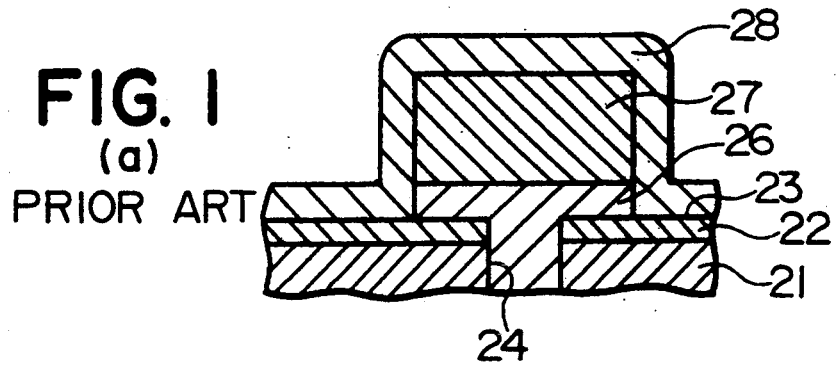
FIG. 1 (a) PRIOR ART
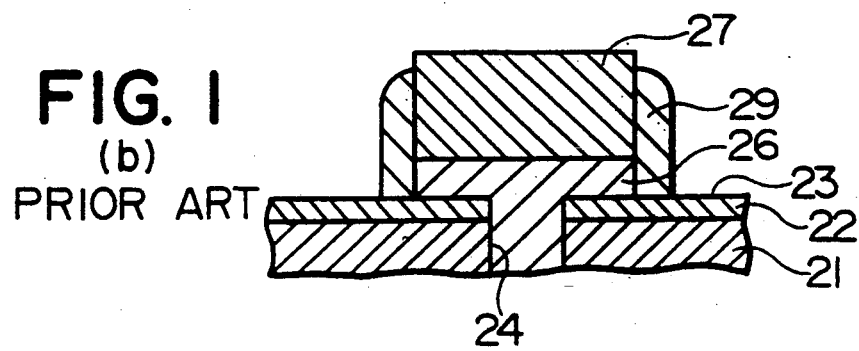
FIG. 1 (b) PRIOR ART
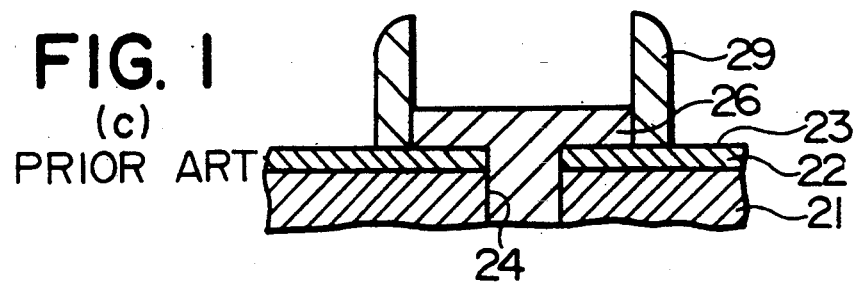
FIG. 1 (c) PRIOR ART
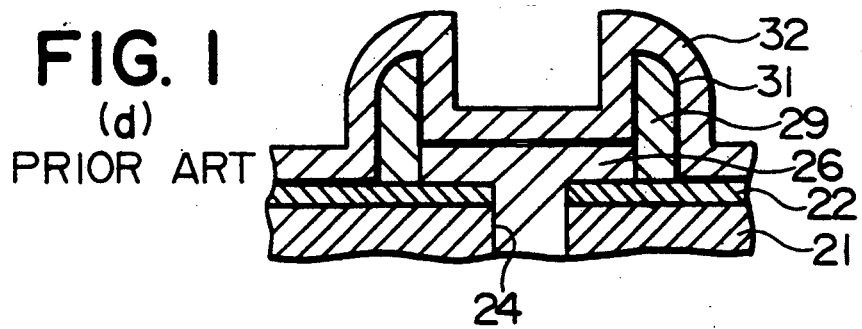
FIG. 1 (d) PRIOR ART FIG. 11 (a)
FIG. 11 (b)
FIG. 11 (c)
FIG. 11 (d)
FIG. 11 (e)
FIG. 11 (f)
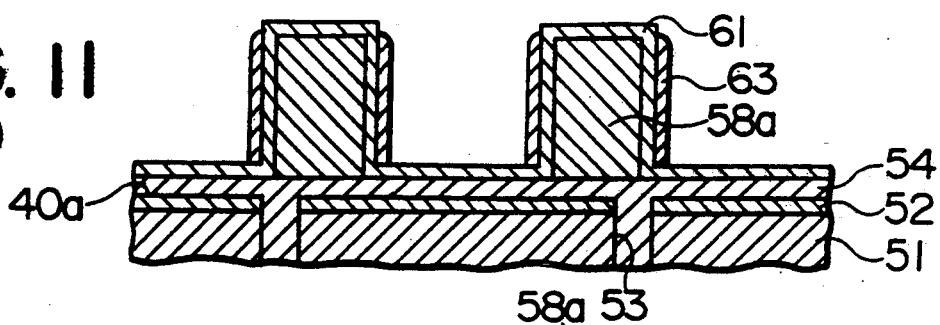
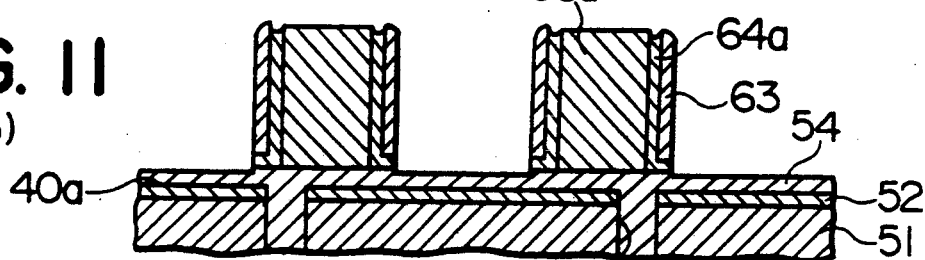
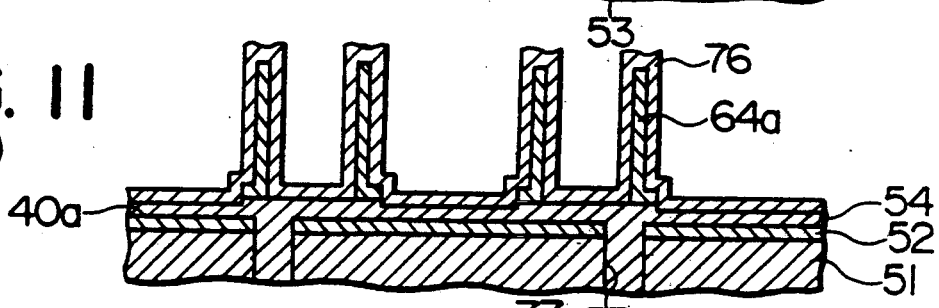
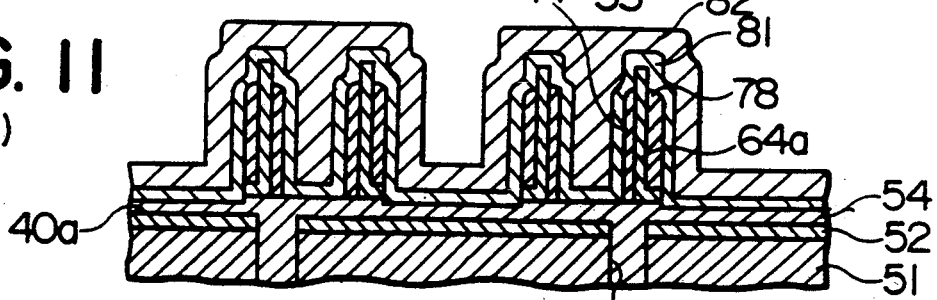
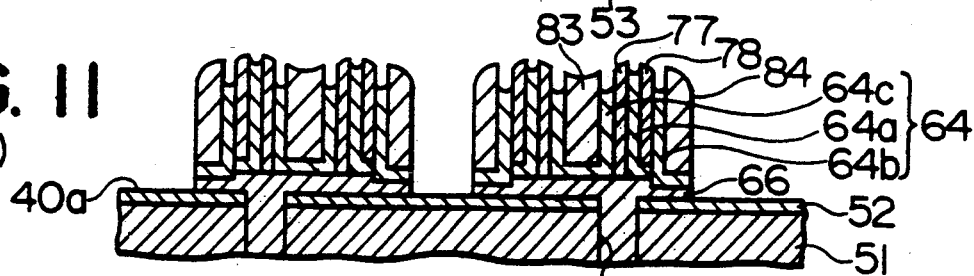
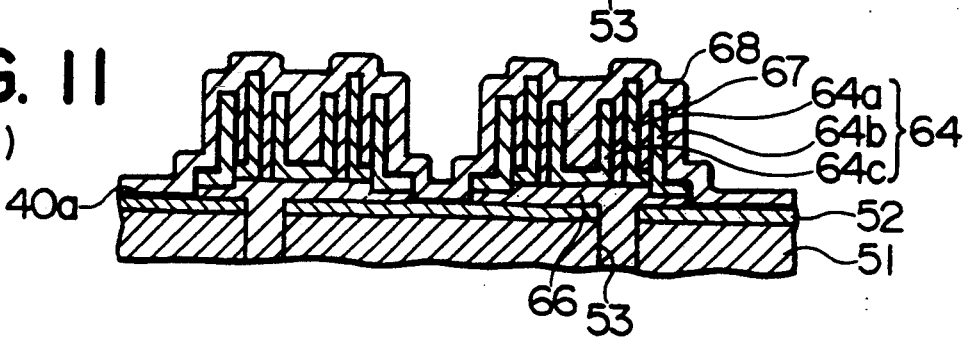

METHOD OF RELIABLY AND READILY MANUFACTURING A SEMICONDUCTOR DEVICE HAVING A CYLINDRICAL ELECTRODE

BACKGROUND OF THE INVENTION

This invention relates to a method of manufacturing a semiconductor device having a cylindrical electrode.

A recent technical development has brought about a semiconductor device which is capable of providing various electric parts, such as a dynamic random access memory (DRAM) and others.

A conventional DRAM comprises a plurality of stacked capacitors. In the manner known in the art, each of stacked capacitors includes a cylindrical electrode.

Such a cylindrical electrode can be made in the method which will be described in the following. At first, a support member or a block is made of a silicon oxide on a semiconductor tip. Next, the support member is covered with an electrode-forming film which is made of one of a conductive material and a semiconductive material. Thereafter, the electrode-forming film is applied with anisotropic etching known in the art. As a result, the electrode-forming film is partially deleted to form the cylindrical electrode. Such a method is disclosed in a paper contributed by K. Iguchi et al to 1991 Symposium on VLSI Technology, Technical Digest, page 11 and will later be described in detail with reference to the drawing.

In the above-mentioned method, the support member has a side surface which is also etched during the anisotropic etching. Accordingly, the cylindrical electrode has a thickness which inevitably becomes thin. This results in reduction of the electrode's mechanical strength. In the worst case, the entire surface is etched away and consequently no cylindrical electrode is formed at all.

SUMMARY OF THE INVENTION

It is therefore an object of this invention to provide a method of reliably and readily manufacturing a semiconductor device having a cylindrical electrode.

It is another object of this invention to provide a method of the type described, which can readily form the cylindrical electrode having a sufficient thickness.

Other objects of this invention will become clear as the description proceeds.

According to an aspect of this invention, there is provided a method of manufacturing a semiconductor device having a principal surface and a cylindrical electrode on the principal surface. The method includes the steps of forming a block on the principal surface, forming an electrode-forming film to cover the block, and partially deleting the electrode-forming film from the block to produce the cylindrical electrode. The electrode-forming film is made of one of a conductive material and a semiconductive material and has a specific film portion which is for forming the cylindrical electrode. In the method, the partially deleting step comprises the steps of forming a covering film to cover the electrode-forming film, etching the covering film so that the covering film has a particular film portion which is unetched to cover the specific film portion, and etching the electrode-forming film with the block and the particular film portion preventing the specific film portion from being etched.

According to another aspect of this invention, there is provided a method of manufacturing a semiconductor device having a principal surface and a cylindrical electrode on the principal surface. The cylindrical electrode has a first and a second electrode element. The method comprises the steps of forming a block on the principal surface, forming a first electrode-forming film to cover the block, the first electrode-forming film being made of one of a conductive material and a semiconductive material and having a first specific film portion which is for forming the first electrode element, providing a first particular film portion to cover the first specific film portion, forming a second electrode-forming film to cover the first electrode-forming film and the first particular film portion, the second electrode-forming film being made of one of a conductive material and a semiconductive material and having a second specific film portion which is for forming the second electrode element, providing a second particular film portion to cover the second specific film portion, and etching the first and the second electrode-forming films with the block and the first particular film portion preventing the first specific film portion from being etched and with the first and the second particular film portions preventing the second specific film portion from being etched.

According to still another aspect of this invention, there is provided a method of manufacturing a semiconductor device having a principal surface and a cylindrical electrode on the principal surface. The cylindrical electrode having a first, a second, and a third electrode element each of which is cylindrical around an axis perpendicular to the principal surface. The method comprises the steps of forming a block on the principal surface, forming a first electrode-forming film to cover the block, the first electrode-forming film being made of one of a conductive material and a semiconductive material and having a first specific film portion which is for forming the first electrode element, providing a first particular film portion to cover the first specific film portion, etching the first electrode-forming film with the block and the first particular film portion preventing the first specific film portion from being etched, etching the base block and the fist particular film portion while the first specific film portion is unetched, providing a second and a third particular film portion to cover the first specific film portion, forming a second electrode-forming film to cover the first specific film portion and the second and the third particular film portions, the second electrode-forming film being made of one of a conductive material and a semiconductive material and having a second and a third specific film portion which are for forming the second and the third electrode elements, respectively, providing a fourth and a fifth particular film portion to cover the second and the third specific film portions, respectively, and etching the second electrode-forming film with the second, the third, the fourth, and the fifth particular film portions preventing the first, the second, and the third specific film portions from being etched.

BRIEF DESCRIPTION OF THE DRAWINGS

FIGS. 1(a)–(d) are a series of sectional views for describing a conventional method of manufacturing a semiconductor device comprising a DRAM cell;

FIGS. 11(a)-(f) are a series of sectional views for describing a method according to a fifth embodiment of this invention.

DESCRIPTION OF THE PREFERRED EMBODIMENTS

Figure 2:
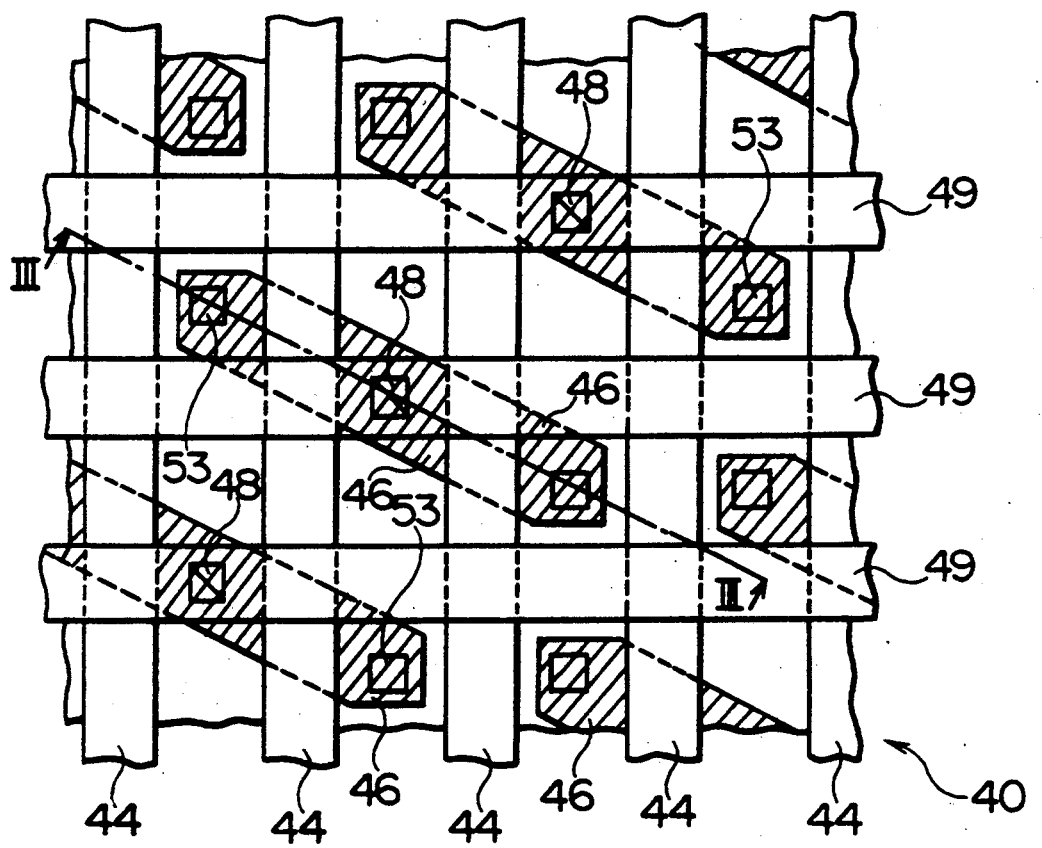
FIG. 2 is a plan view schematically illustrating a base member for use in a method according to a first embodiment of this invention.

Referring to FIG. 1, description will at first be made as regards a conventional method for a better understanding of this invention. The conventional method is of manufacturing a semiconductor device comprising a DRAM cell known in the art.

Referring to a sectional view labelled (a), the semiconductor device is manufactured by the use of a semiconductor chip having an interlayer-insulating film 21. A silicon nitride film 22 is deposited on the interlayer-insulating film 21 and has a principal surface 23. After a contact hole 24 is formed in the interlayer-insulating and the silicon nitride films 21 and 22, a polycrystal silicon film and a silicon oxide film are successively deposited on the silicon nitride film 22 and thereafter patterned to form a bottom electrode 26 and a block or a support member 27. Then, a polycrystal silicon film 28 is deposited or formed as an electrode-forming film on the silicon nitride film 22, the bottom electrode 26, and the support member 27 to cover them.

Subsequently, anisotropic etching is applied to remove the polycrystal silicon film 28 by a predetermined thickness in a vertical direction perpendicular to the principal surface 23. Thus, the polycrystal silicon film 28 is partially deleted from the support member 27 as illustrated in a sectional view labelled 1(b). As a result, a cylindrical electrode 29 is formed on the principal surface 23.

Turning to a sectional view labelled 1(c), only the support member 27 is removed or deleted in the manner known in the art. As a result, a cylindrical space is formed inside the cylindrical electrode 29.

Turning to a sectional view labelled 1(d), a dielectric film 31 (a silicon oxide film, a silicon nitride film, a composite film thereof, and so on) is formed to cover the silicon nitride film 22 and the exposed surface of the cylindrical electrodes 26 and 29. The dielectric film 31 is one of a silicon oxide film, a silicon nitride film, a composite film thereof, and so on. In addition, a polycrystal silicon film 32 is formed as an additional electrode on the dielectric film 31. Thus, a stacked capacitor is obtained.

The conventional method has a disadvantage as described in the preamble of the specification.

Turning to FIGS. 2 through 6, the description will be directed to a method according to a first embodiment of this invention. The method is of manufacturing a semiconductor device similar to the semiconductor device described referring to FIG. 1. The semiconductor device in question comprises a DRAM cell known in the art. The DRAM includes a bit line and a stacked capacitor above the bit line and therefore is generally called that of a stacked capacitor type. In the manner known in the art, the stacked capacitor comprises a lower electrode, an upper electrode, and a dielectric film therebetween. The lower electrode is generally called a node electrode. The upper electrode is generally called a cell plate.

Figure 3:
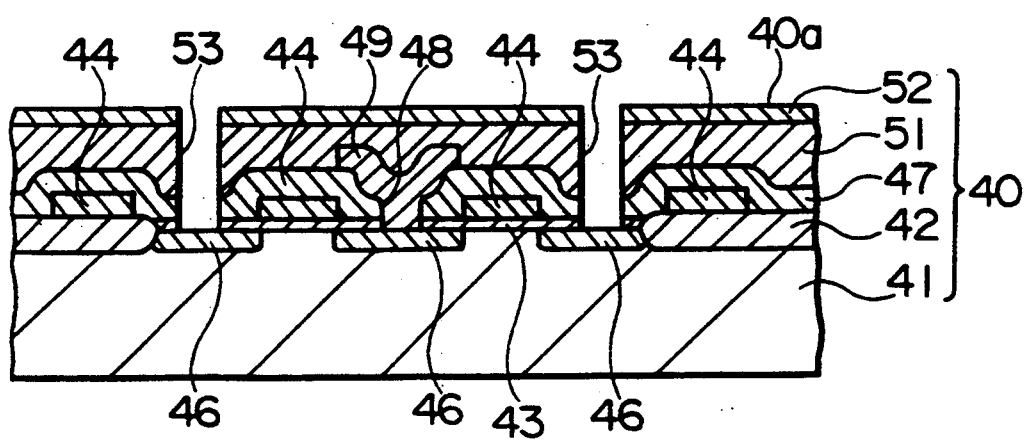
FIG. 3 is a section view taken along a line III—III in FIG. 2.

At first referring to FIGS. 2 and 3, the description will be made as regards a base member 40 made by the use of a silicon substrate 41 of a p-type. An isolation oxide film 42 if formed on an upper surface of the silicon substrate 41 by the use of a selective oxidation method known in the art. The isolation oxide film 42 has a thickness of 400 nanometers and define an active region.

Next, a gate oxide film 43 is formed on an upper surface of the active region. After forming the gate oxide film 43, a plurality of word lines 44 are formed in the silicon substrate 41. Each of the word lines 44 is made of a polycrystal silicon film to have a thickness of 300 nanometers. Then, a plurality of n±type diffusion layer 46 are formed by ion implantation known in the art.

Subsequently, a first interlayer-insulating film 47 is formed. The first interlayer-insulating film 47 contains silicon oxide as a main component thereof. A plurality of primary contact holes 48 are opened to reach the n±type diffusion layer 46 through the gate oxide film 43 and the first interlayer-insulating film 47. A plurality of bit lines 49 are formed through the primary contact holes 48, respectively. Each of the bit lines 49 is made of a polycide structure comprising a polycrystal silicon film and a tungsten silicide film.

Next, a second interlayer-insulating film 51 is formed. The second interlayer-insulating film 51 contains silicon oxide as a main component thereof. A silicon nitride film 52 is formed on the second interlayer-insulating film 51 to have a thickness of 100 nanometers.

Subsequently, a plurality of secondary contact holes 53 are formed to reach the n±type diffusion layer 46 through the silicon nitride, the second interlayer-insulating, the first interlayer-insulating, and the gate oxide films 52, 51, 47, and 43. In the manner described above, the base member 40 is obtained and has a principal surface 40a.

Figure 4:
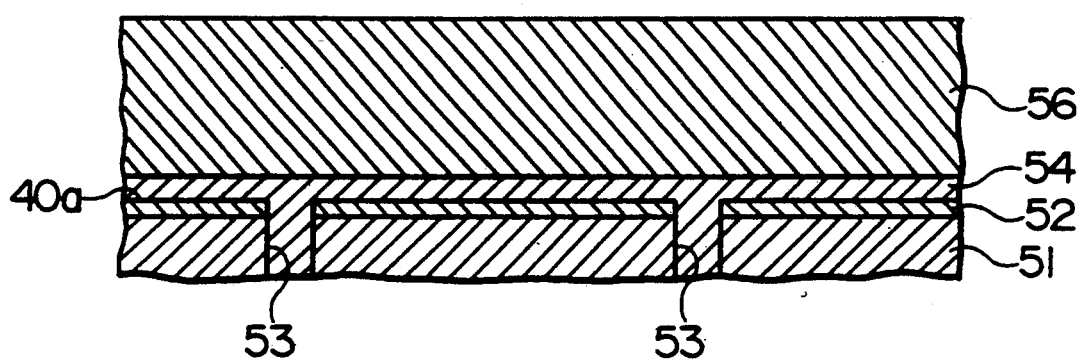
FIG. 4 is a sect al view for describing steps of forming a first and a second underlying film on the base member illustrated in FIG. 2.

Turning to FIG. 4, a first underlying film 54 is formed on the principal surface 40a of the base member 40 to have a thickness of 100 nanometers. The first underlying film 54 is made of polycrystal silicon and extends in each of the secondary contact holes 53. Then, a second underlying film 56 is formed on the first underlying film 54 to have a thickness of 700 nanometers. The second underlying film 54 is made of silicon oxide.

Figure 5:
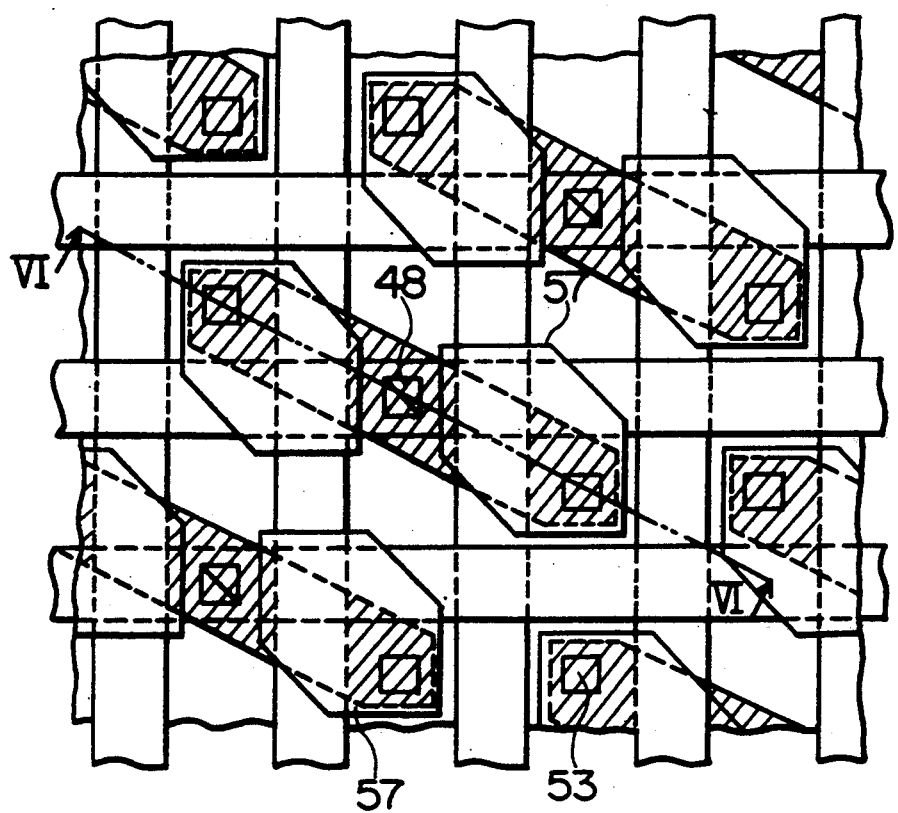
FIG. 5 is a schematic plan view for describing steps of partially deleting the second underlying film to form a support member on the first underlying film.
Figure 6:
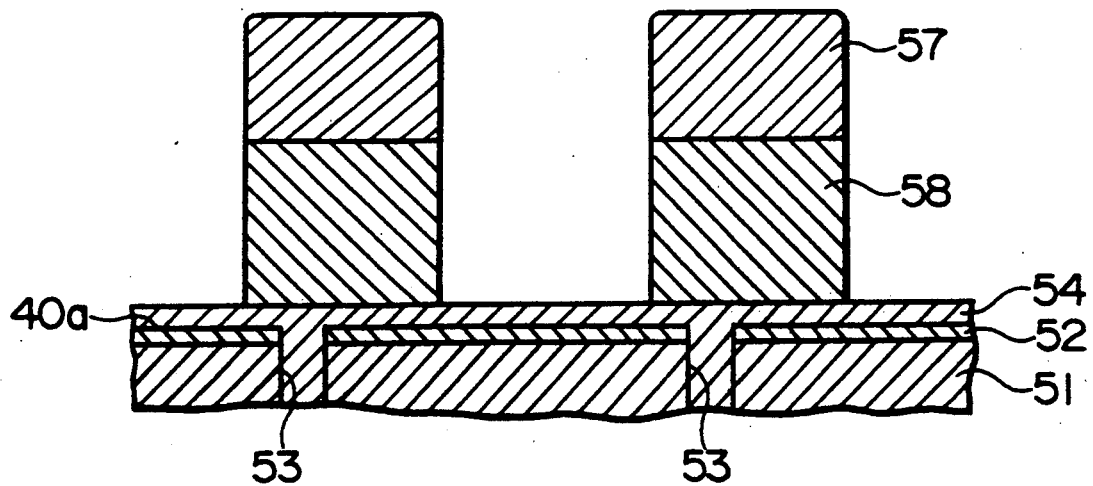
FIG. 6 is a sectional View taken along a line VI—VI in FIG. 5.

Next, the description will be made as regards manufacturing of the lower electrode of the stacked capacitor. Referring to FIGS. 5 and 6, a plurality of photoresist films 57 are formed as masks on the second underlying film 56 to have an interval of 0.5 μm by the use of photolithography known in the art. Each of the photoresist films 57 has a hexagonal plane. It is assumed that the DRAM cell has a size of 1.25 μm×2.5 μm while each of the word lines and the bit lines have a width of 0.5 μm and an interval of 1.0 μm. Next, the second underlying film 56 is etched with protection by the photoresist films 57 to form a plurality of blocks or support members 58 which are below the photoresist films 57. Thereafter, the photoresist films 57 are removed from the support members 58.

For simplicity, the description will hereinafter be made in conjunction with only a selected one of the support members 58. Similarly, although the electrodes can be formed of any conductive or semiconductive material the description relates to the case where they are formed of polycrystal silicon.

Turning to FIGS. 7(a)-7(e), the description will proceed to the method according to this invention. Referring to a sectional view labelled FIG. 7(a), an electrode-forming film 61 is formed to cover the first underlying film 54 and the selected support member that is designated by a reference numeral 58a. The electrode-forming film 61 is made of polycrystal silicon and is thinner than the second underlying film 56 to have a thickness of 100 nanometers. The electrode-forming film 61 has an electrode portion generally defined by specific film portion which cylindrically extends to surround the support member 58a.

Next, a covering film 62 is formed on the electrode-forming film 61 to have a thickness of 100 nanometers. The covering protective film 62 is silicon oxide and has a particular film portion which extends along and surrounds the specific film portion, to thereby form a protective sleeve about the cylindrical electrode portion.

Anisotropic etching is applied to the covering film 62 by the use of CF$_4$ gas. In this event, the covering film 62 is partially removed from the electrode-forming film 61 to leave the particular film portion as a protective wall 63 illustrated in a sectional view labelled FIG. 7(b).

Each of the first underlying and the electrode-forming films 54 and 61 is etched by applying an etching method which does not etch silicon oxide. In this event, it is to be noted that the specific film portion is not substantially etched because the specific film portion is covered with the particular film portion 63 that is not etched by the etching method. The etching method may be HBr plasma etching. As a result of etching, the lower electrode is formed to have a cylindrical electrode 64, formed of the specific film portion of the electrode forming film 61, and a bottom electrode 66, formed of the unetched part of the first underlying film 54, as illustrated in a sectional view labelled FIG. 7(c). The cylindrical and the bottom electrodes 64 and 66 are not removed (because of the protection by the support member 58a and the protective wall 63) and are connected to each other.

Next, the support member 58a and the protective wall 63 are removed by the use of an etching solution containing hydrogen fluoride. As a result, the cylindrical and the bottom electrodes 64 and 66 are exposed as illustrated in a sectional view labelled FIG. 7(d). Phosphorus of $5 \times 10^{15}$ cm$^{-2}$ is implanted by ion implantation to render the cylindrical and the bottom electrodes 64 and 66 into an n$^+$ type.

Turning to a sectional view labelled FIG. 7(e), a dielectric film 67 is formed to cover the cylindrical and the bottom electrodes 64 and 66. Furthermore, an additional electrode-forming film 68 is deposited on the dielectric film 67 to form an additional electrode as the upper electrode. The additional electrode-forming film 68 is made of polycrystal silicon. Thus, the DRAM cell of the stacked capacitor type is obtained. In practice, the DRAM cell achieves 60 fF/cell when the dielectric film 67 has a thickness corresponding to a level of 6 nanometers in terms of a conventional oxide film.

Turning to FIGS. 8(a)-(e), the description will be directed to a method according to a second embodiment of this invention. The method is of manufacturing a semiconductor device similar to the semiconductor device described referring to FIGS. 7(a)-(e). The semiconductor device in question comprises similar parts designated by like reference numerals. The method is similar in process to that according to the first embodiment until forming the photoresist films designated by a reference numeral 57 in FIGS. 5 and 6.

Referring to, together with FIGS. 4, 5, and 6, a sectional view labelled FIG. 8(a), the second underlying and the first underlying films 54 and 56 are partially etched with the photoresist film 57 used as the mask. Thus, the support member 58a is formed on the bottom electrode 66 that is formed on the silicon nitride film 52. Thereafter, the photoresist film 57 is removed from the support member 58a.

After removing the photoresist film 57, the electrode-forming and the covering films 61 and 62 are successively formed as illustrated in a sectional view labelled FIG. 8(a). The electrode-forming film 61 has a thickness of 100 nanometers. The covering film 62 has a thickness of 100 nanometers. The anisotropic etching is applied to the covering film 62 by the use of CH$_4$ gas. As a result, the covering film 62 is partially removed from the electrode-forming film 61 to leave the particular film portion as the protective wall 63 illustrated in a sectional view labelled FIG. 8(b).

After carrying out the anisotropic etching, the electrode-forming film 61 is etched with protection by the protective wall 63. In this event, it is to be noted that the protective wall 63 is not etched. As a result of etching, the electrode-forming film 61 is partially removed from the support member 58a to leave the specific film portion as the cylindrical electrode 64 as illustrated in a sectional view labelled FIGS. 7(a)-(e). The cylindrical electrode 64 has an axis perpendicular to the principal surface 40a.

Next, the support member 58a and the protective wall 63 are removed in the manner known in the art. Thereafter, phosphorus ion implantation is carried out. Thus, the lower electrode is formed to have the cylindrical and the bottom electrodes 64 and 66 as illustrated in a sectional view labelled FIG. 8(d). It is to be noted here that the cylindrical electrode 64 has an inner surface connected to the bottom electrode 66.

Turning to a sectional view labelled FIG. 8(e), the dielectric film 67 is formed to cover the cylindrical and the bottom electrodes 64 and 66. After forming the dielectric film 67, the additional electrode-forming film 68 is deposited on the dielectric film 67 to form the additional or upper electrode. The additional electrode-forming film 68 is made of polycrystal silicon.

Figure 7:
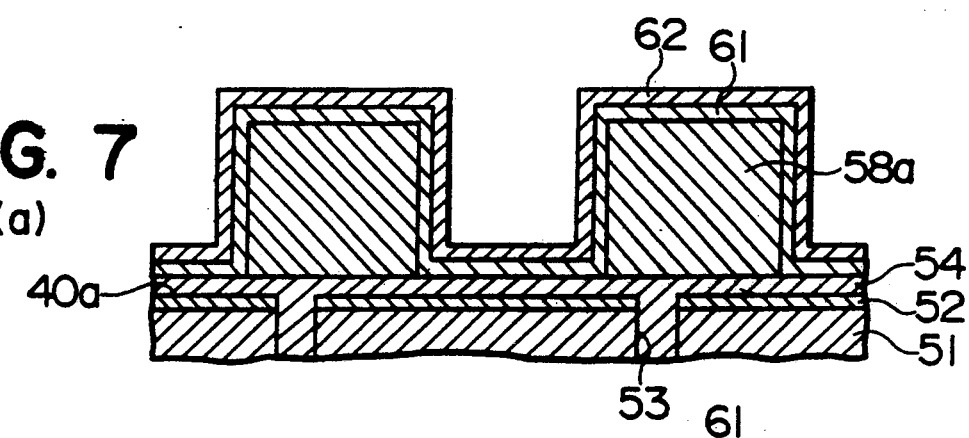
FIGS. 7(a)-(e) are a series of sectional views for describing steps of forming a DRAM cell on the base member by the use of the support member.
Figure 7:
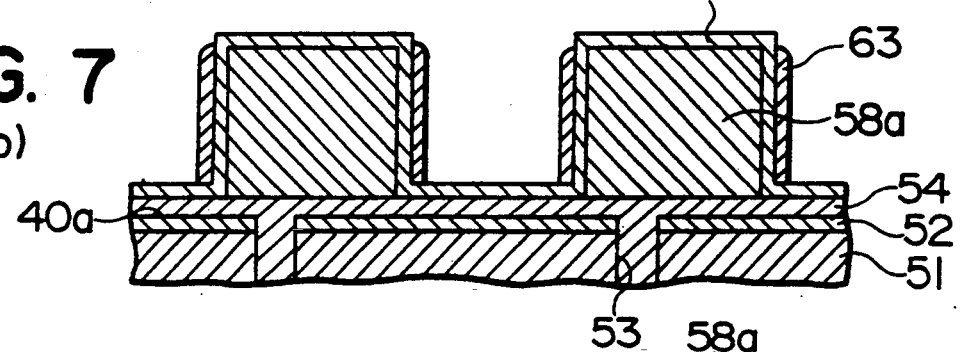
Figure 7:
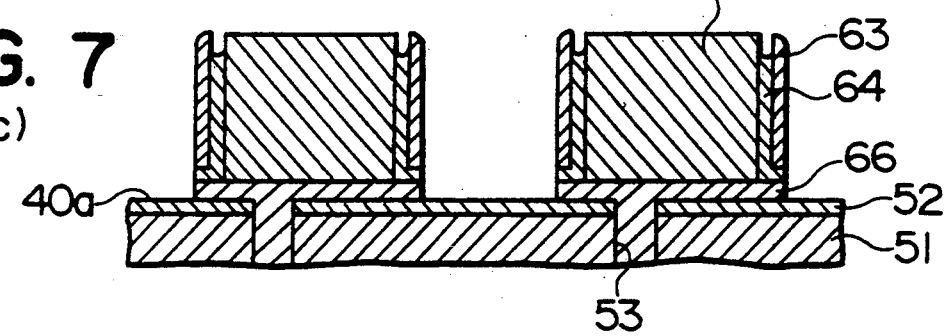
Figure 7:
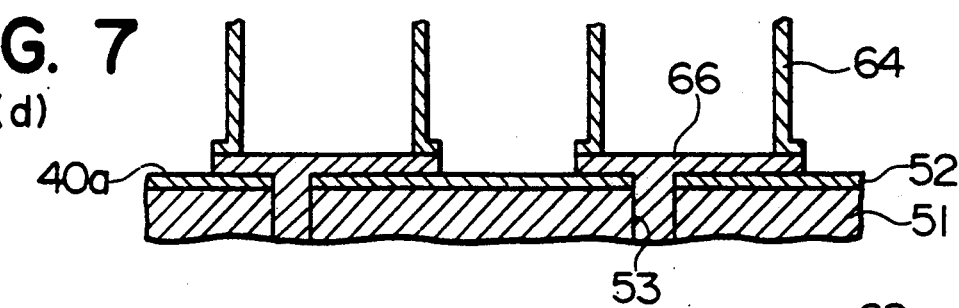
Figure 7:
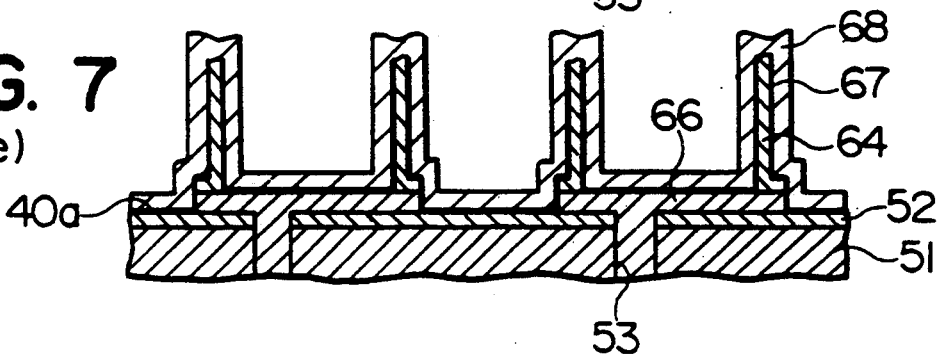
Figure 8:
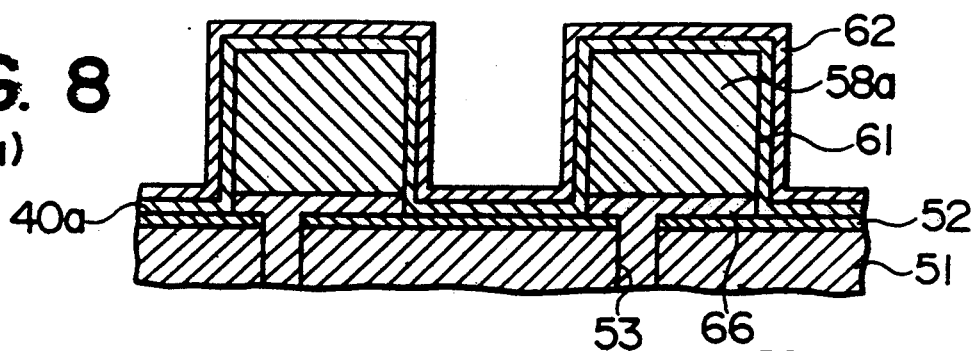
FIGS. 8(a)-(e) are a series of sectional views for describing a method according to a second embodiment of this invention.
Figure 8:
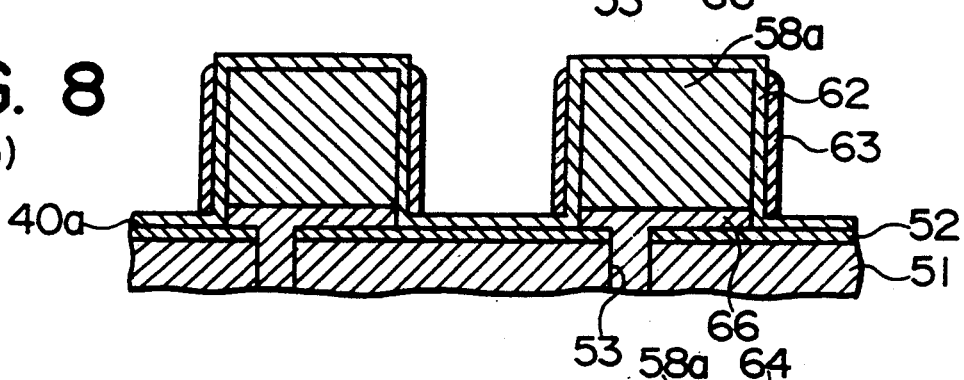
Figure 8:
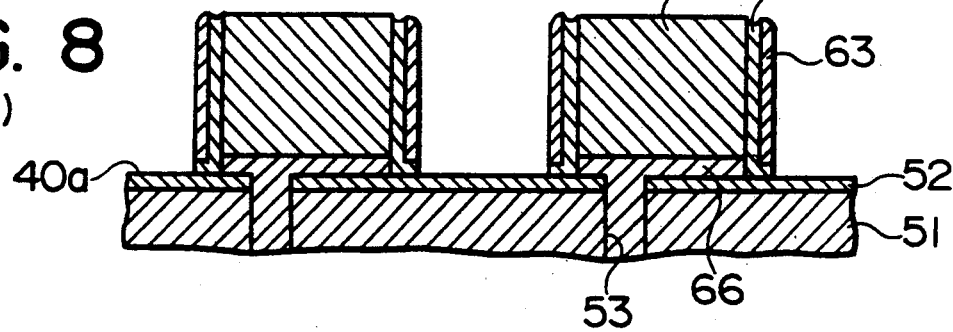
Figure 8:
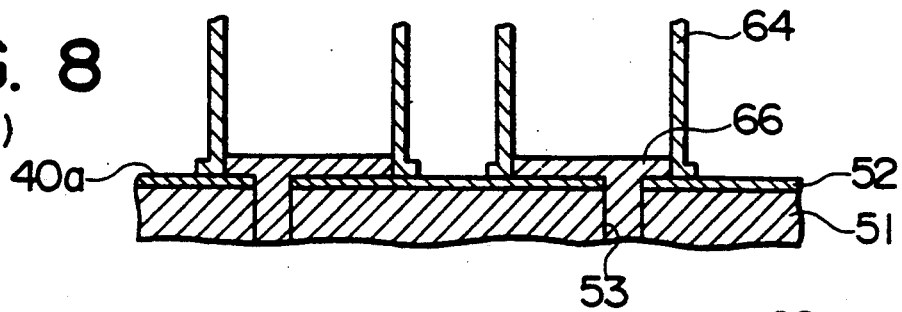
Figure 8:
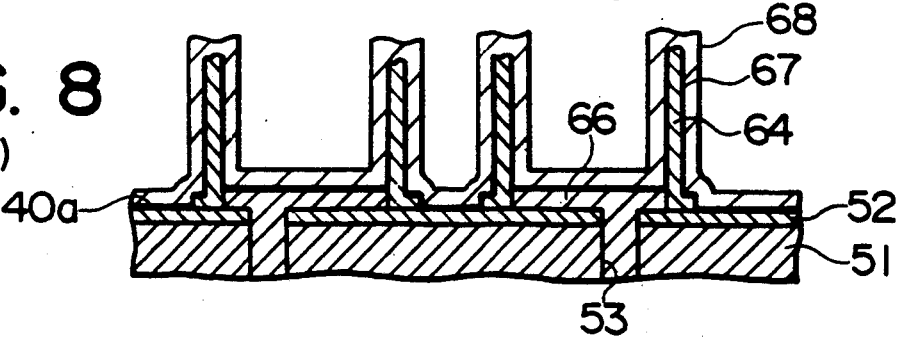

With this structure, the cylindrical electrode 64 can be made higher than the cylindrical electrode that is described referring to FIGS. 7 (a)-(e). Accordingly, a capacitance can be increased correspondingly.

Turning to FIGS. 9(a)–(d), the description will be directed to a method according to a third embodiment of this invention. The method is of manufacturing a semiconductor device modified from the semiconductor device that is described referring to each of FIGS. 7 and 8. The semiconductor device in question comprises similar parts designated by like reference numerals.

The first electrode-forming film 61 is referred to herein as a first electrode-forming film and has a first electrode-forming film and has a first electrode portion defined by a first specific film portion which cylindrically extends to surround the support member 58a. In the manner described above, the protective wall 63 is formed to surround the first specific film portion of the first electrode-forming film 61. The protective wall 63 is referred to herein as a first particular film portion which extends along the first specific film portion.

Although the support member 58a is formed in the manner similar to the first embodiment, it has a plane of hexagonal which is smaller than that of the support lo member in the first embodiment. Each side of the plane is located 200 nanometers inside from each side of the support member 58a. The electrode-forming film 61 has a thickness of 100 nanometers. The protective wall 63 has a thickness of 100 nanometers.

Figure 9:
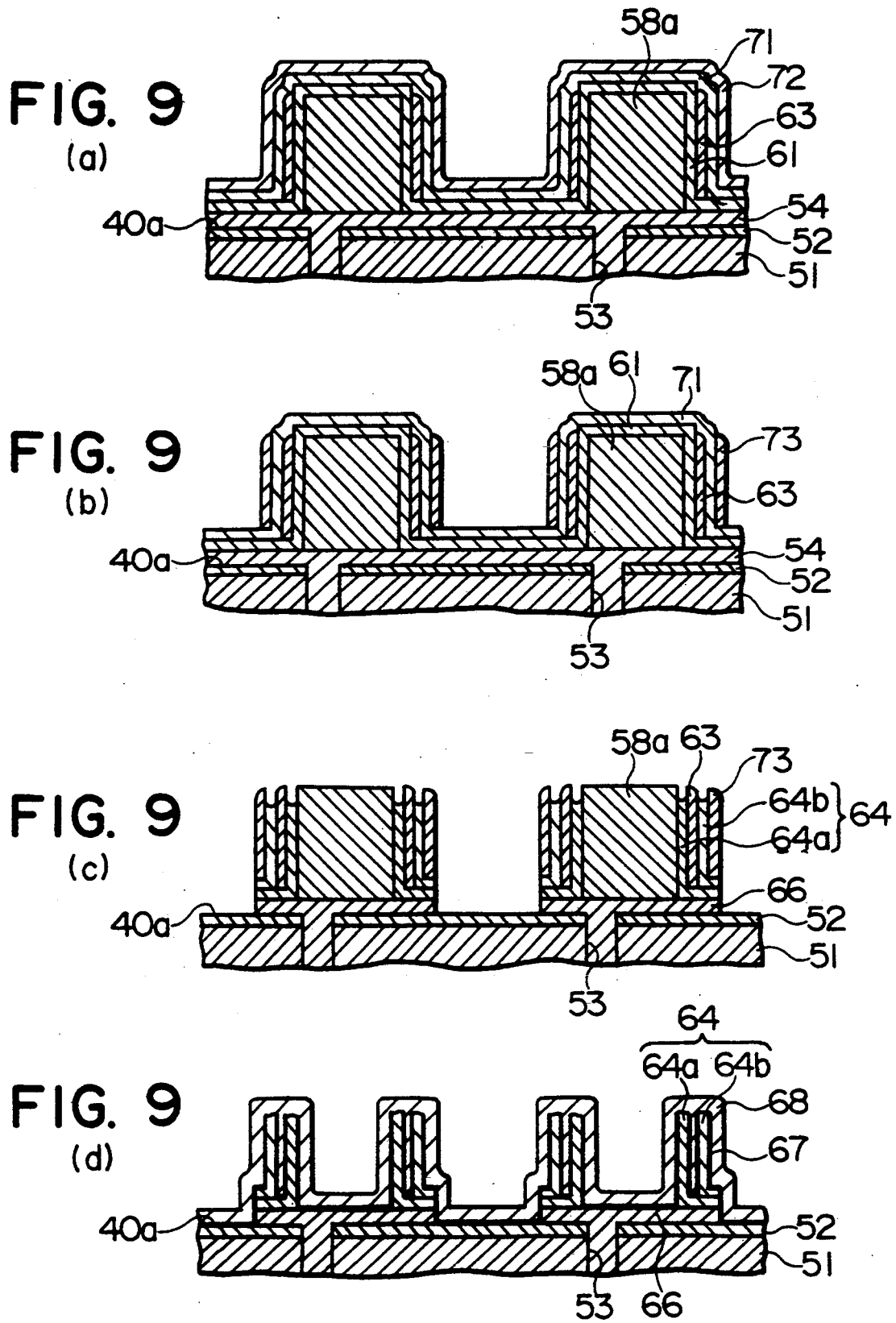
FIGS. 9(a)-(d) are a series of sectional views for describing a method according to a third embodiment of this invention.

After forming the protective wall 63, second electrode-forming and second covering films 71 and 72 are successively deposited without carrying out the etching of the first underlying and the first electrode-forming films 54 and 61 as illustrated in a sectional view labelled FIG. 9(a). The second electrode-forming film 71 is made of polycrystal silicon and has a thickness of 100 nanometers. The second electrode-forming film 71 has a second electrode portion defined by a second specific film portion which cylindrically extends to surround the protective portion 63.

The second covering film 72 is made of silicon oxide and has a thickness of 100 nanometers. The second protective film 72 has a second particular film portion which extends along the second specific film portion.

Next, the anisotropic etching is applied to the second covering film 72. As a result, the second covering film 72 is partially removed to leave the second particular film portion as an additional protective wall 73 as illustrated in a sectional view labelled FIG. 9(b).

Each of the first underlying, the first electrode-forming, the second electrode forming films 54, 61, and 71 is selectively etched by HBr plasma etching with protection by the protective films 63 and 73. As a result, the cylindrical and the bottom electrodes 64 and 66 are formed. It is to be noted here that the cylindrical electrode 64 comprises first and second electrode elements 64a and 64b as illustrated in a sectional view labelled FIG. 9(c). Each of the first and the second electrode element 64a and 64b is cylindrical around an axis perpendicular to the principal surface 40a.

Next, the support member 58a and the protective films 63 and 73 are removed by the use of an etching solution of fluoric acid in the manner known in the art. In addition, phosphorus ion implantation is carried out.

Turning to a sectional view labelled FIG. 9(d), the dielectric film 67 is formed to cover the cylindrical and the bottom electrodes 64 and 66. Furthermore, the additional electrode-forming film 68 is deposited on the dielectric film 67 to form the additional or upper electrode. Thus, a two-fold cylindrical stacked capacitor is obtained.

Generally, an n-fold cylindrical electrode and a bottom electrode are formed by repeating n times, after formation of a support member, a set of steps comprising formation of a polycrystal silicon film and formation of a protective wall, and by selectively removing the polycrystal silicon film.

Turning to FIGS. 10(a)–(e), the description will be directed to a method according to a fourth embodiment of this invention. The method is of manufacturing a semiconductor device similar to the semiconductor device described referring to FIGS. 9(a)–(d). The semiconductor device in question comprises similar parts designated by like reference numerals.

In the manner described above, the bottom electrode 66 and the first electrode element 64a are formed on the principal surface 40a. After forming the bottom electrode 66 and the first electrode element 64a, the second electrode-forming and the second covering films 71 and 72 are successively formed as illustrated in a sectional view labelled FIG. 10(a). The second electrode-forming film 71 has a thickness of 100 nanometers. The second covering film 72 has a thickness of 100 nanometers.

Figure 10:
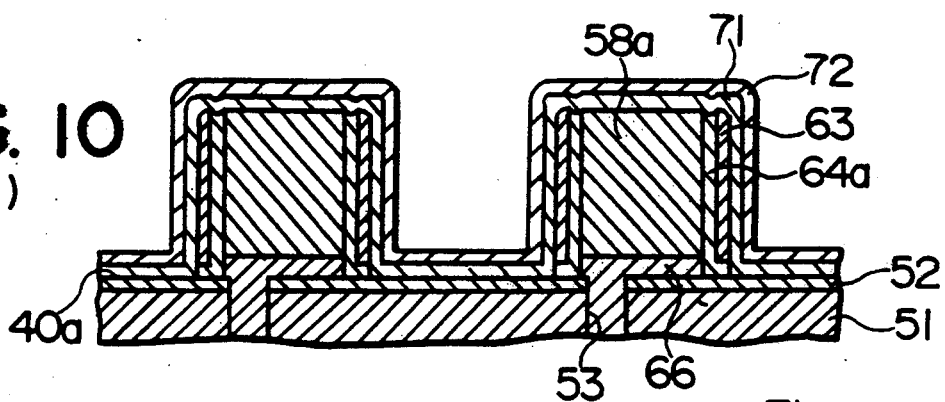
FIGS. 10(a)-(e) are a series of sectional views for describing a method according to a fourth embodiment of this invention.
Figure 10:
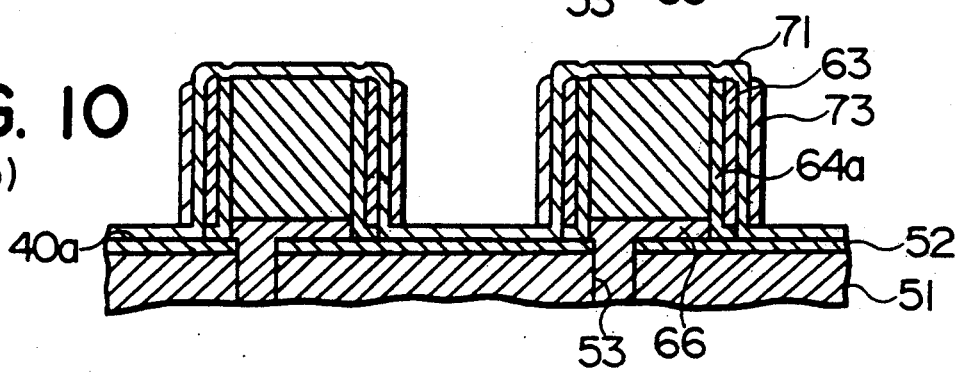
Figure 10:
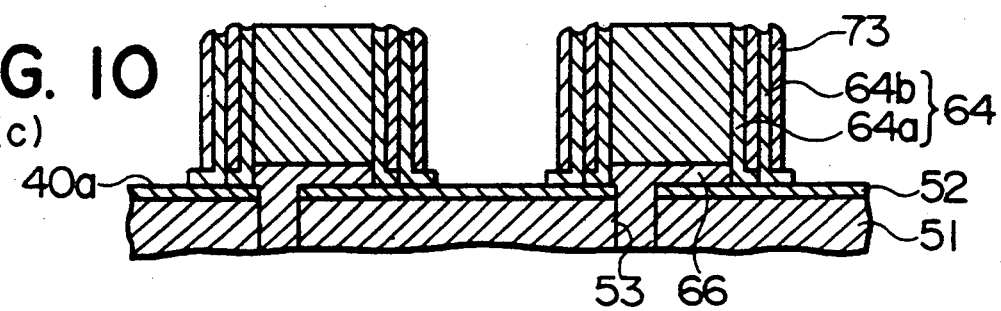
Figure 10:
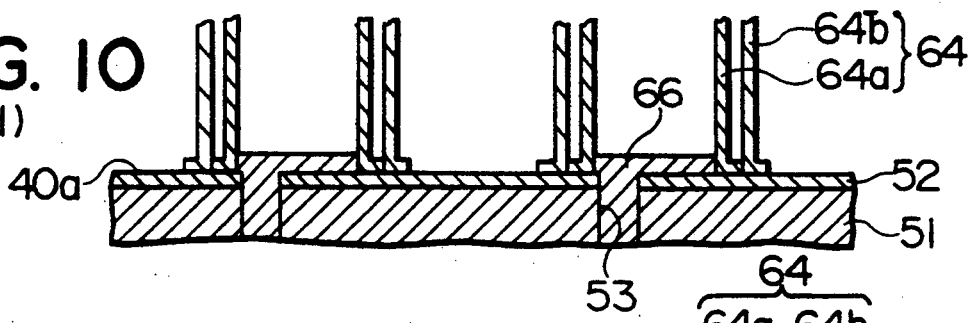
Figure 10:
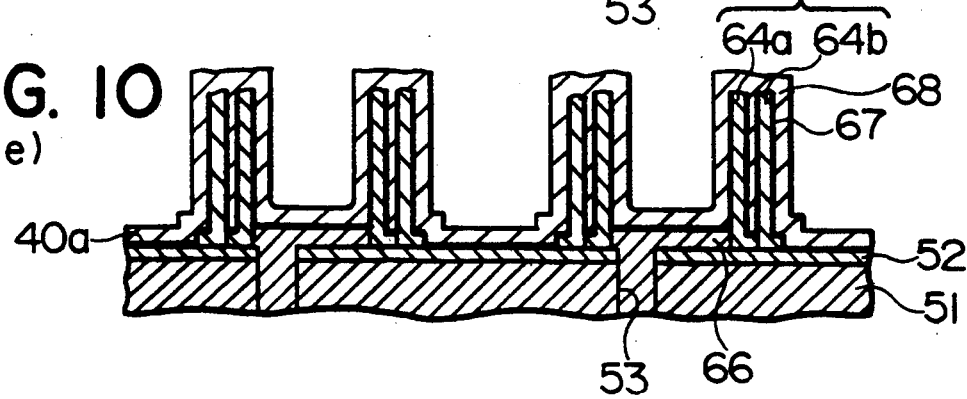

The second covering protective film 72 is subjected to the anisotropic etching to form the additional protective wall 73 as illustrated in a sectional view labelled FIG. 10(b). Subsequently, the second electrode-forming film 71 is etched with protection by the additional protective wall 73 to form the second electrode element 64b as illustrated in a sectional view labelled FIG. 10(c). Each of the first and the second electrode elements 64a and 64b is cylindrical around an axis perpendicular to the principal surface 40a. It is to be noted that the second electrode element 64b is connected to the first electrode element 64a.

In addition, phosphorus ion implantation is carried out. Thus, formation of the lower electrode is completed as illustrated in a sectional view labelled FIG. 10(d).

Turning to a sectional view labelled FIG. 10(e), the dielectric film 67 is formed to cover the cylindrical and the bottom electrodes 64 and 66. Furthermore, the additional electrode-forming film 68 is deposited on the dielectric film 67 to form the additional or upper electrode. Thus, the two-fold cylindrical stacked capacitor is obtained.

The second electrode element 64b has a height of about 200 nanometers higher than that in the third embodiment. Accordingly, a capacitance can be greater than each stacked capacitor that is described above.

Generally, an n-fold cylindrical electrode is formed by repeating n times, after formation of a support member and a bottom electrode, a set of steps of successively forming a polycrystal silicon film and a silicon oxide film, carrying out etching, and forming a cylindrical electrode and a protective wall.

Turning to FIGS. 11(a)–(f), the description will be directed to a method according to a fifth embodiment of this invention. The method is of manufacturing a semiconductor device modified from the semiconductor device that is described referring to FIGS. 10(a)–10(e). The semiconductor device in question comprises similar parts designated by like reference numerals. In the manner described above, the protective wall 63 is formed to surround the first specific portion of the first-electrode forming film 61. The protective wall 63 will be called hereafter a first protective wall.

Returning back to FIG. 5 shortly, each of the photoresist films 57 has two sides which obliquely intersect each of the word lines 44 and has a distance therebetween. The distance is designed between 750 and 800 nanometers.

Referring to a sectional view labelled FIG. 11(a), the support member 58a and the first electrode-forming film 61 are formed on the principal surface 40a so that the first electrode-forming film 61 covers the support member 58a. The first protective wall 63 is cylindrically formed to surround the first electrode-forming film 61.

The first electrode-forming film 61 is etched with protection by the first protective wall 63 in the manner described above. As a result of etching, the first electrode-forming film 61 is removed from the support member 58a to leave the first specific film portion as the first electrode element 64 as illustrated in a sectional view labelled FIG. 11(b).

Next, the support member. 58a and the first protective wall 63 are removed in the manner known in the art. After removing the support member 58a and the protective wall 63, a second covering film 76 is formed on the first underlying film 54 and the first electrode element 64a as illustrated in a sectional view labelled FIG. 11(c). The second covering film 76 is made of silicon oxide and has a thickness of 100 nanometers. The second covering protective film 76 has a second and a third particular film portion which will become clear in the following.

Subsequently, the second covering protective film 76 is subjected to the anisotropic etching. As a result, the second covering film 76 is partially removed to leave the second and the third particular film portions as the second and the third protective walls 77 and 78 as illustrated in a sectional view labelled FIG. 11(d). Then, second electrode-forming and third covering films 81 and 82 are successively formed. The second electrode-forming film 81 is made of polycrystal silicon and has a thickness of 100 nanometers. The third covering film 82 is made of silicon oxide and has a thickness of 200 nanometers. It is desirable to select the thickness of the third covering film 82 so that the third covering film 82 has an upper surface which is substantially flat within the first electrode element 64a. The third covering protective film 82 has a fourth and a fifth particular film portion which will become clear in the following.

The third covering protective film 82 is subjected to the anisotropic etching. As a result, the third covering film 82 is partially removed to leave the fourth and the fifth particular film portions as fourth and fifth protective walls 83 and 84.

Next, the first underlying and the second electrode-forming films 54 and 81 are partially etched to form the bottom electrode 66 and the second and a third electrode element 64b and 64c as illustrated in a sectional view labelled FIG. 11(e). In this event, the first specific film portion is slightly etched to form the first electrode element 64a. The third electrode element 64c is cylindrical around an axis perpendicular to the principal surface 40a. It is to be noted that the first electrode element 64a has a height reduced.

Subsequently, the second, the third, the fourth, and the fifth protective walls 77, 78, 83, and 84 are removed. Phosphorus ion implantation is carried out.

Turning to a sectional view labelled FIG. 11(f), the dielectric film 67 is formed to cover the cylindrical and the bottom electrodes 64 and 66. Furthermore, the additional electrode-forming film 68 is deposited on the dielectric film 67 to form the additional or upper electrode. Thus, a three-fold cylindrical stacked capacitor is obtained.

Generally, a (2n+1)-fold cylindrical electrode is formed by carrying out n sets of steps, each set comprising the steps of at first forming one electrode element, forming protective walls inside and outside thereof, respectively, forming a polycrystal silicon film, and forming another protective wall. In this event, formation of a bottom electrode is completed when etching is carried out to form a last electrode element.

Turning to FIGS. 12(a)–(d), the description will be directed to a method according to a second embodiment of this invention. The method is of manufacturing a semiconductor device similar to the semiconductor device that is described referring to FIGS. 11(a)–(f). The semiconductor device in question comprises similar parts designated by like reference numerals.

Figure 12:
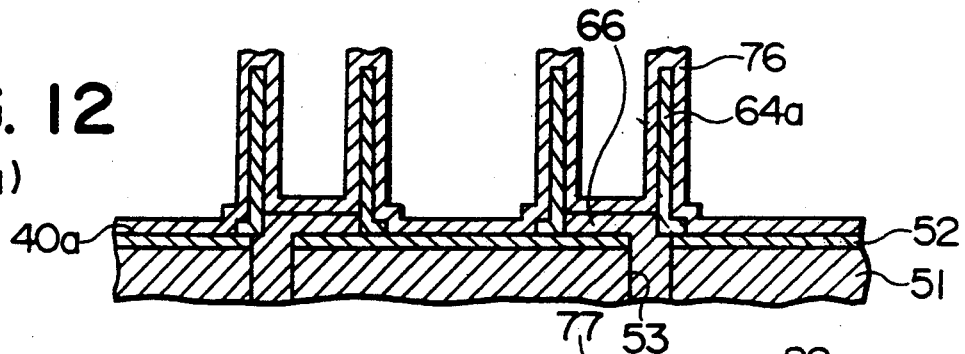
FIGS. 12(a)-(d) are a series of sectional views for describing a method according to a sixth embodiment of this invention.
Figure 12:
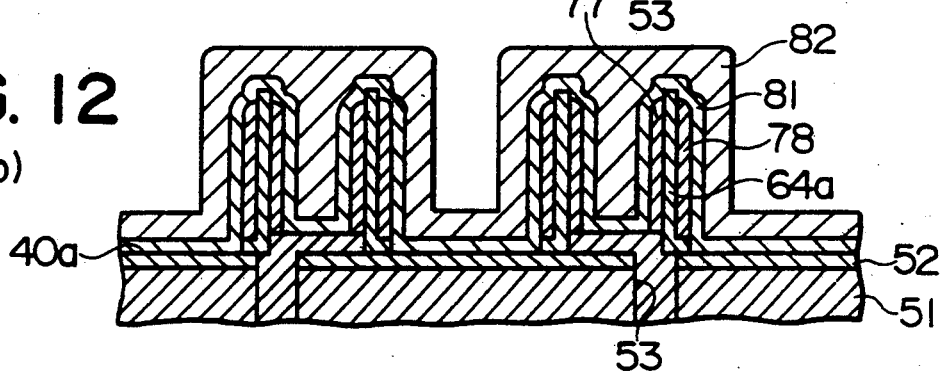
Figure 12:
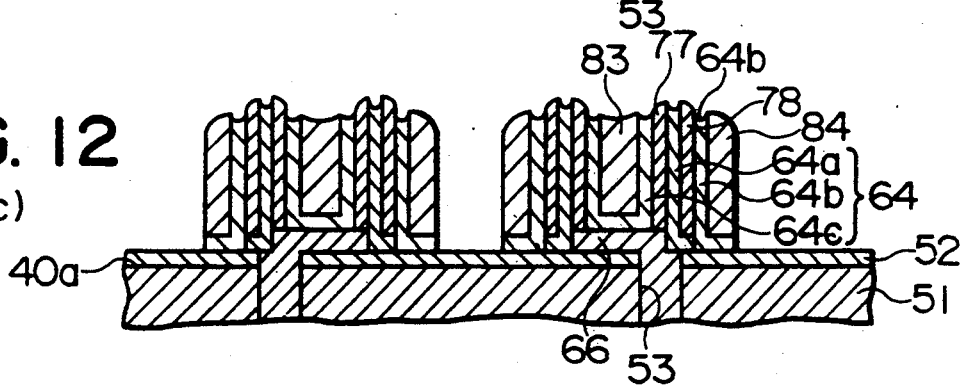
Figure 12:
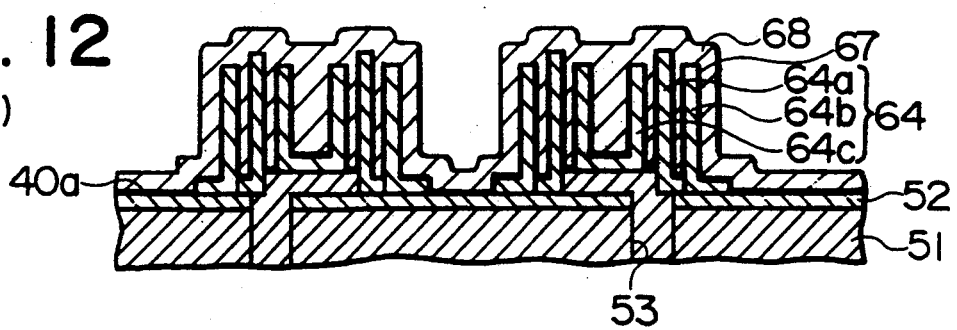

Referring to a sectional view labelled FIG. 12(a), the bottom electrode 66 and the first electrode element 64a are formed in the manner described above. Then, the second covering protective film 76 is formed on the bottom electrode 66 and the first electrode element 64a to have a thickness of 100 nanometers. After forming the second covering protective film 76, the anisotropic etching is carried out to form the second and the third protective walls 77 and 78 as illustrated in a sectional view labelled FIG. 12(b). Next, the second electrode-forming and the third covering films 81 and 82 are successively formed. The second electrode-forming film 81 has a thickness of 100 nanometers. The third covering film 82 has a thickness of 200 nanometers.

Then, the third covering protective film 82 is subjected to the anisotropic etching. As a result of the anisotropic etching, the fourth and the fifth protective walls 83 and 84 are formed as illustrated in a sectional view labelled FIG. 12(c). Subsequently, the second electrode-forming film 81 is partially etched to form the second and the third electrode elements 64b and 64c. In this event, the first electrode element 64a is reduced in height. The second, the third, the fourth, and the fifth protective walls 77, 78, 83, and 84 are removed. Phosphorus ion implantation is carried out.

Turning to a sectional view labelled FIG. 12(d), the dielectric film 67 is formed to cover the cylindrical electrode 64 and the bottom electrode 66. Furthermore, the additional electrode-forming film 68 is deposited on the dielectric film 67 to form the additional or upper electrode. Thus, the three-fold cylindrical stacked capacitor is obtained.

In the three-fold cylindrical stacked capacitor, a capacitance is increased inasmuch as the second electrode element 64 is higher than the second electrode element that is described referring to FIGS. 11(a)–(f). The lower electrode can be formed through the steps less in number than in the process of the fourth embodiment.

Generally, a (2n+1)-fold cylindrical electrode is formed by repeating n times a process comprising the steps of at first forming one electrode element, forming protective walls inside and outside thereof, respectively, forming a polycrystal silicon film, forming another protective wall, and forming two other electrode elements.

While the present invention has thus far been described in connection with a few embodiments thereof, it will readily be possible for those skilled in the art to put this invention into practice in various other manners. For example, the polycrystal silicon film may be replaced by a high-melting-point metal film such as tungsten or a silicide film thereof. It is possible to manufacture a semiconductor device such as SCF known in the art. Any other appropriate technique (diffusion, addition during deposition, or the like) may be used in place of ion implantation. Use can be made of elements such as arsenic, boron, and germanium belonging to the groups 3, 4, and 5. In the DRAM cell, a conductor type of doping is preferably same as that of the diffusion layer connecting the lower electrode.

What is claimed is:

1. A method of manufacturing a semiconductor device having a principal surface and a cylindrical electrode on said principal surface, said cylindrical electrode having a first, a second, and a third electrode elements each of which is cylindrical around an axis perpendicular to said principal surface, said method comprising the steps of:

forming a support member on said principal surface;

forming a first electrode-forming film to cover said support member, said first electrode-forming film being made of one of a conductive material and a semiconductive material and having a first electrode portion surrounding said support member for forming said first electrode element;

providing a first protective film to cover said first electrode portion;

etching said first electrode-forming film with said support member and said first protective film preventing said first electrode portion from being etched, thereby forming said first electrode element around said support member;

etching said support member and said first protective film while said first electrode element remains unetched;

providing a second protective film to cover said first electrode film portion;

forming a second electrode-forming film to cover said first electrode film portion and said second protective film, said second electrode-forming film being made of one of a conductive material and a semiconductive material and having a second and a third electrode portions for forming said second and said third electrode elements, respectively;

providing a third protective film to cover said second and said third electrode portions, respectively; and etching said second electrode-forming film with said second, and said third protective films preventing said first, said second, and said third electrode portions from being etched, thereby producing said second electrode element around said first electrode element, and said third electrode element in the area previously occupied by said support member and surrounded by said first and second electrode elements.

2. A method as claimed in claim 1, wherein said third-mentioned providing step comprises the steps of etching said third protective film so that said fourth and said fifth electrode cover portions are unetched to cover said second and said third electrode portions, respectively.

3. A method as claimed in claim 1, further comprising the steps of:

etching said second, said third electrode cover portions while said first, said second, and said third electrode portions are unetched to produce said first, said second, and said third electrode elements, respectively.

4. A method as claimed in claim 3, further comprising the steps of:

forming a dielectric film on said cylindrical electrode; and forming an additional electrode on said dielectric film, said additional electrode being made of one of a conductive material and a semiconductive material.

* * * * *

UNITED STATES PATENT AND TRADEMARK OFFICE
CERTIFICATE OF CORRECTION

PATENT NO.   : 5,438,010
DATED        : August 1, 1995
INVENTOR(S)  : Takanori SAEKI It is certified that error(s) appears in the above-identified patent and that said Letters Patent is hereby corrected as shown below:

Col. 3, line 1, delete "section" and insert --sectional--.

Col. 3, line 3, delete "sectal" and insert --sectional--.

Signed and Sealed this

Sixteenth Day of January, 1996

Attest:

BRUCE LEHMAN

*Attesting Officer*  *Commissioner of Patents and Trademarks*